(12) United States Patent
Rashid

(10) Patent No.: US 7,187,774 B2
(45) Date of Patent: Mar. 6, 2007

(54) MUTE SWITCH

(75) Inventor: Tahir Rashid, Middlesex (GB)

(73) Assignee: STMicroelectronics Limited, Bristol (GB)

( * ) Notice: Subject to any disclaimer, the term of this patent is extended or adjusted under 35 U.S.C. 154(b) by 510 days.

(21) Appl. No.: 10/147,436

(22) Filed: May 15, 2002

(65) Prior Publication Data

US 2003/0016836 A1    Jan. 23, 2003

(30) Foreign Application Priority Data

May 15, 2001  (EP)  ................................. 01304303

(51) Int. Cl.
*H04B 15/00*    (2006.01)
(52) U.S. Cl. ...................... 381/94.5; 381/104
(58) Field of Classification Search ............... 381/94.5, 381/94.1, 104; 330/51, 149, 307, 278
See application file for complete search history.

(56) References Cited

U.S. PATENT DOCUMENTS

| | | | |
|---|---|---|---|
| 5,201,009 A | * | 4/1993 | Yamada et al. ............. 381/104 |
| 5,300,892 A | * | 4/1994 | Hirai ............................ 330/51 |
| 5,394,476 A | * | 2/1995 | Rollins et al. .............. 381/104 |
| 6,016,352 A | | 1/2000 | Barmore .................... 381/94.5 |
| 6,563,376 B2 | * | 5/2003 | Fujisawa ..................... 330/10 |

FOREIGN PATENT DOCUMENTS

JP    2001127569    5/2001

OTHER PUBLICATIONS

Sedra. A. et al. "Microelectronic Circuits". New York, Oxford University Press, 4th ed., 1998. p. 221-22, 232-238, 253-254, 282, 290-294, and 810-812.*

* cited by examiner

*Primary Examiner*—Sinh Tran
*Assistant Examiner*—Walter F. Briney, III
(74) *Attorney, Agent, or Firm*—Lisa K. Jorgenson; E. Russell Tarleton; Seed IP Law Group PLLC

(57) ABSTRACT

A mute switch including a field effect transistor receiving a mute control signal at its gate for selectively supplying an audio signal from an input node to an output node. A bipolar transistor is connected between the input node and the FET for reducing the voltage level of the audio signal prior to its application to the input node, and a further bipolar transistor is connected between the FET and the output node for raising the voltage level of the audio signal prior to its application to the output node. This serves to maintain the DC bias level of the audio output signal independently of the status of the mute control signal.

11 Claims, 2 Drawing Sheets

US 7,187,774 B2

MUTE SWITCH

BACKGROUND OF THE INVENTION

1. Field of the Invention

The present invention relates to a mute switch, used in audio circuits to reduce the audio level to zero, and more particularly to a mute switch that can operate at low supply voltages.

2. Description of the Related Art

Mute switches are typically placed in the path between an audio input node and audio output node such that that path can be "disconnected" to reduce the level of the audio output signal at the audio output node to zero when required. The mute switch is controlled by a mute control signal.

An existing mute switch is discussed in more detail later with reference to FIG. 1, but takes the form of a simple MOS transistor. There are two difficulties with such a switch. The first is that the voltage level of the mute control signal that is required to control the switch can exceed the voltage supply level for low voltage applications. Clearly this is unsatisfactory. Another difficulty is that the DC bias level of the audio output signal will alter depending on the status of the mute control signal and the resulting state of the mute control switch. This can introduce annoying and possibly damaging "pops and clicks" which can be heard when the switch is used.

BRIEF SUMMARY OF THE INVENTION

The disclosed embodiments of the invention overcome the first of these difficulties and enables the voltage level of the mute control switch to be reduced in particular for low voltage applications. The invention also overcomes the problems associated with change of the DC bias level in the audio output signal.

According to one aspect of the present invention there is provided a mute switch that includes: a first switching element having a control gate for receiving a mute control signal and a controllable path for selectively supplying an audio signal from an input node to an output node; a voltage reduction component connected between said input node and the switching element for reducing the voltage level of the audio signal prior to its application to the input node; and a voltage raising component connected between the switching element and the output node for raising the voltage level of the audio signal prior to its application to the output node.

In accordance with another aspect, a method of operating a mute control switch is provided that includes the steps of: reducing the voltage level of an audio input signal prior to its application to a controllable path of the control switch; selectively switching the mute control switch using a mute control signal; and raising the voltage level of an audio signal passed by the mute control switch prior to applying said audio signal to an output node.

Ideally, circuitry is provided for maintaining the DC level of the audio signal regardless of the status of the mute control signal.

In the described embodiment, such circuitry includes a second switching element controllable by an inverted value of the mute control signal and connected to biasing circuitry such that a bias voltage is selectively supplied to the voltage raising component depending on the status of the mute control signal.

BRIEF DESCRIPTION OF THE SEVERAL VIEWS OF THE DRAWING(S)

For a better understanding of the present invention and to show how the same may be carried into effect, reference will now be made by way of example to the accompanying drawings in which.

DETAILED DESCRIPTION OF THE INVENTION

Figure 1:
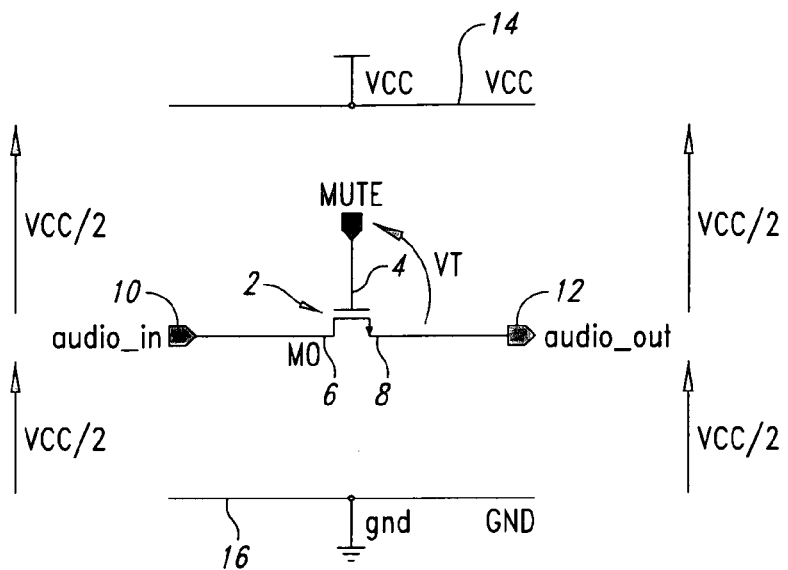
FIG. 1 is a diagram of an existing mute switch.

FIG. 1 illustrates an existing mute switch which comprises an MOS transistor 2 having a gate 4 at which is received a mute control signal labeled MUTE and a drain/source path for selectively passing an audio signal. In FIG. 1 the drain is labeled 6 and the source is labeled 8. An audio input signal audio in is supplied to an audio input node 10 connected to the drain. An output node 12 is connected to the source for the supply of an audio output signal audio out when the mute control signal MUTE is off.

The voltage supply rails for the circuit are shown schematically, the positive supply rail VCC being labeled 14 and the ground supply rail GND being labeled 16. These are not shown connected to anything as they are there for illustrative purposes only to indicate the relative voltage levels in the circuit.

When the mute control signal MUTE is on (i.e., high), the transistor 2 is "closed" and the audio signal is passed from the input node 10 to the output node 12. When it is required to reduce the output audio level to zero, the mute control signal MUTE is turned off (i.e., low), thus turning the transistor 2 off and preventing passage of the audio input signal audio-in from the input node 10 to the output node 12.

The audio input signal is normally biased at half the supply voltage VCC, that is VCC/2. Thus, the control signal MUTE needs to be set to at least:

(VCC/2)+Vaudio+VT, where VT is the threshold voltage of the MOS transistor 2 and Vaudio is the peak audio signal level.

In reality, for low distortion and to accommodate process variations the mute control signal MUTE needs to have a higher level than this to be reliably effective.

Such a switch is adequate as long as VCC/2 exceeds the threshold voltage VT of the MOS transistor 2. However, for low voltage operation this may not be the case. For example, consider a circuit that needs to operate at 1.8V, with a peak audio signal level of around 100 mV using MOS transistors with a voltage threshold in the region of 0.9V. Already in this situation the mute control signal MUTE needs to be 1.9V even to reliably turn on the MOS transistor 2.

However, the supply voltage VCC cannot supply such a level for the mute control signal and in fact in reality to accommodate low distortion, the mute control signal would need to be higher still. Thus a separate voltage supply or alternative way of boosting the voltage supply would be required.

Another difficulty that can arise with the mute switch shown in FIG. 1 is that the DC bias level can alter between the status of the mute control signal being on and off. This can cause annoying and possibly damaging "pops and clicks" that can be heard when the switch is used.

Figure 2:
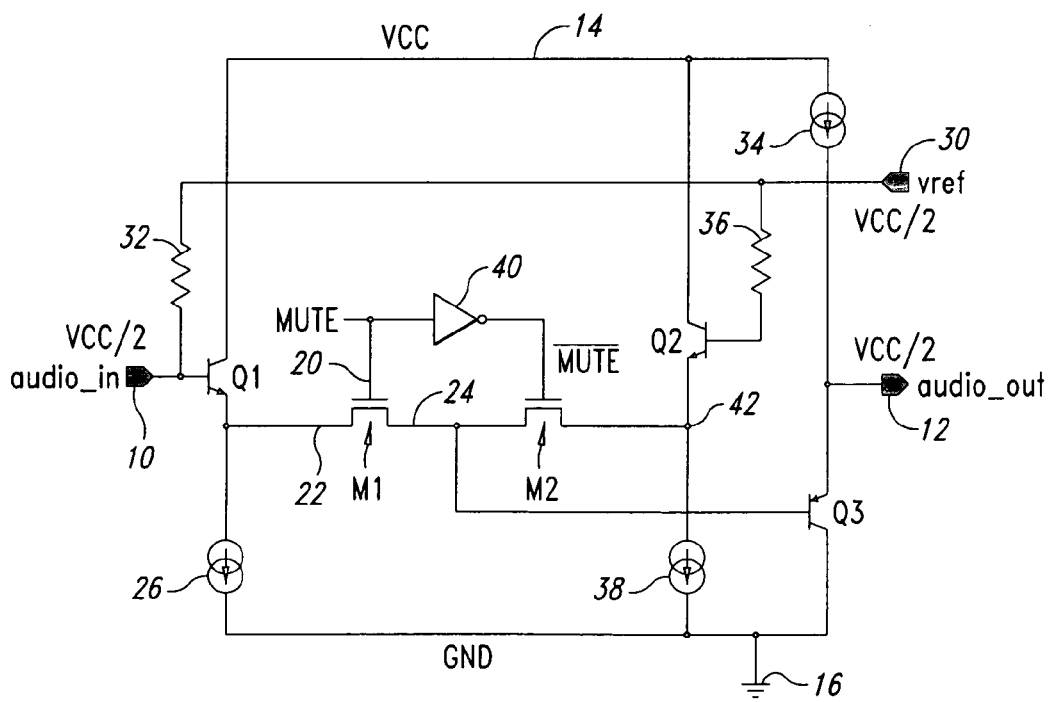
FIG. 2 is a schematic diagram of a mute switch in accordance with one embodiment of the invention.

FIG. 2 illustrates a circuit according to one embodiment of the invention that overcomes these two difficulties.

The switching element in the circuit is denoted M1 and takes the form of an MOS transistor having a gate 20, a drain 22 and a source 24. As before, the mute control signal MUTE is supplied to the gate 20. As in the circuit of FIG. 1, the audio input node is labeled 10 and the audio output node is labeled 12. In the circuit of FIG. 2 however there is a voltage reduction component in the form of a bipolar transistor Q1 which has its base connected to the audio input node 10, its collector connected to the positive voltage supply rail 14 and its emitter connected via a current source 26 to the ground supply rail 16. The emitter of the bipolar transistor Q1 is also connected to the drain 22 of the mute control switch M1. The transistor Q1 has the effect of lowering the voltage level of the audio input signal via the base emitter voltage $V_{be}$ of the transistor Q1 such that the voltage level of the audio signal applied to the drain 22 of the mute control switch M1 is lowered by that amount. For a typical bipolar transistor this can lower the audio level by around 0.7V. The source of the mute control switch 24 is connected to a voltage raising component in the form of another bipolar transistor Q3. This bipolar transistor Q3 has its base connected to the source 24 of the mute control switch M1, its collector connected to the ground supply rail 16, and its emitter connected to the audio output node 12. It is of opposite polarity to the voltage reduction transistor Q1. This transistor accordingly lifts the level of the audio signal passed by the switch M1 via the base emitter voltage of the transistor Q3, which will be similar to the reduction which was introduced by the voltage reduction transistor Q1.

In FIG. 2, the biasing voltage for biasing the audio signal at VCC/2 is illustrated as being input from a bias voltage node 30, where the bias voltage is labeled Vref and has a value of VCC/2. This is supplied via a resistor 32 to the audio input signal audio_in. FIG. 2 further illustrates a current source 34 connected between the positive supply rail 14 and the audio output node 12, which acts to bias the transistor Q3.

FIG. 2 further illustrates circuit components that overcome the difficulty discussed earlier of the "pops and clicks" which can sometimes be heard due to the change in DC bias level when the mute control signal changes its status. These circuit components are a second MOS transistor labeled M2, a further bipolar transistor labeled Q2, a resistor 36, a current source 38, and an inverter 40. These circuit components are connected as follows.

The inverter 40 is connected to receive the mute control signal MUTE and to supply an inverted version thereof to the gate of the transistor M2. The source/drain path of the transistor M2 is connected between the mute control switch M1 and a voltage node 42. That voltage node is held at a voltage level being VCC/2-$V_{beQ2}$ by virtue of the biasing arrangement introduced by the resistor 36, which is connected between the bias input voltage node 30 and the base of the bipolar transistor Q2. The emitter of the transistor Q2 is connected to the voltage node 42 while the collector of the transistor Q2 is connected to the positive voltage supply rail 14. The current source 38 is connected between the voltage node 42 and the ground supply rail 16. It can be seen that the circuit elements transistor Q2, resistor 36, and current source 38 to some extent mirror the circuit elements transistor Q1, current source 26, and resistor 32 on the input side of the circuit. The current source 38 biases the transistor Q2.

However, because an inverted version of the mute signal MUTE is supplied to the transistor M2, as M1 is made open circuit by the mute signal, M2 is closed. Hence the transistor Q2 and the transistor M2 maintain the DC conditions at the base of the voltage raising transistor Q3 and hence at the output of the circuit.

Thus, the circuit of FIG. 2 has two distinct advantages over the known circuit of FIG. 1.

Firstly, a lower voltage level for the mute control signal MUTE is adequate, possibly of around 1.5V for a 1.8 voltage supply, due to the fact that the DC level of the audio input signal, audio_in, is reduced prior to its application to the mute control switch.

Secondly, a further biasing arrangement is introduced to ensure that the DC conditions are maintained at the output node regardless of the status of the mute control switch. This avoids the irritating and possibly damaging "pops and click" which can occur when there is a change in the DC bias at the output node with a change in status of the mute control signal.

Figure 3:
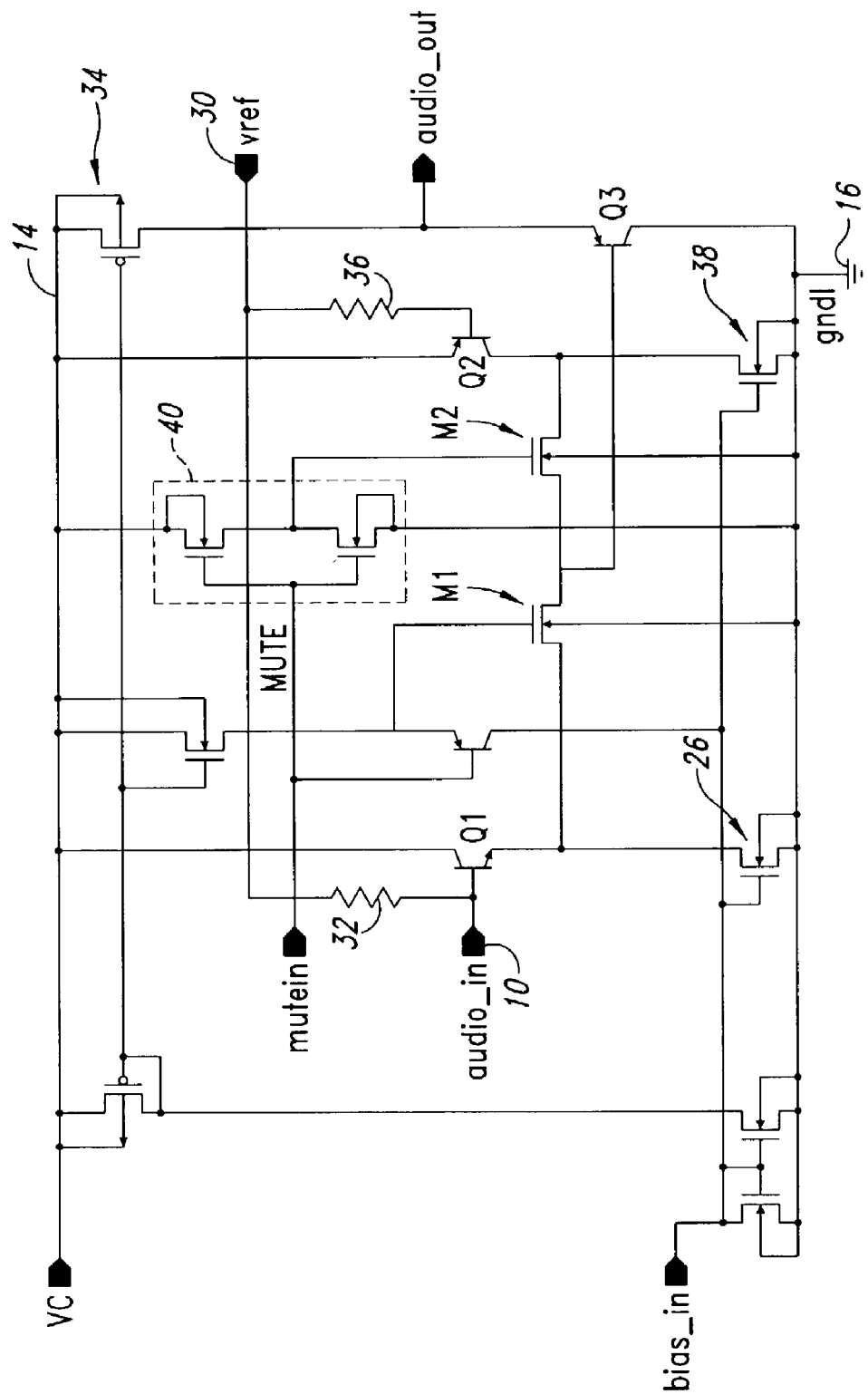
FIG. 3 is a circuit diagram of a particular implementation of a mute switch.

FIG. 3 illustrates a transistor implementation of the circuit of FIG. 2. Like numerals denote like circuit elements as in FIG. 2. The remaining circuit elements illustrated in FIG. 3 are not discussed further herein because they do not form part of the invention but are illustrated for the sake of completeness for one particular working implementation of the circuit.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A mute switch circuit for an audio component, comprising:
    a switch element having a control gate responsive to a mute control signal and a controllable path between a first terminal and a second terminal for selectively supplying an audio signal from an input node to an output node;
    a first bipolar transistor having a base coupled to the input node, an emitter coupled to the first terminal of the switch element, and a collector coupled to a voltage supply;
    a second bipolar transistor having a base coupled to the second terminal of the switch element and an emitter coupled to the output node;
    a first current source coupled between the emitter of the first bipolar transistor and a ground reference terminal;
    a third bipolar transistor having a base coupled to a voltage reference, a collector coupled to the voltage source, and an emitter coupled to the second terminal of the switch element; and
    a second current source coupled between the emitter of the third bipolar transistor and the ground reference terminal.

2. The circuit of claim 1 wherein the switch element comprises a field effect transistor.

3. The circuit of claim 1 wherein the first bipolar transistor comprises a voltage reduction component configured to reduce the voltage level of the audio signal.

4. The circuit of claim 3 wherein the voltage reduction component reduces the voltage level of the audio signal without eliminating the audio signal prior to applying the audio signal to the input node.

5. The circuit of claim 1 wherein the second bipolar transistor comprises a voltage raising component configured to raise the voltage level of the audio signal prior to applying the audio signal to the output node.

6. The circuit of claim 1, further comprising an inverter having an input coupled to the control gate of the switch element and to receive the mute control signal and an output coupled to a control terminal of a switch coupled in the controllable path between the switch element and the output node.

7. A mute switch circuit for an audio component, comprising:
- a switch element having a control gate responsive to a mute control signal and a controllable path between a first terminal and a second terminal for selectively supplying an audio signal from an input node to an output node;
- a first bipolar transistor having a base coupled to the input node, an emitter coupled to the first terminal of the switch element, and a collector coupled to a voltage supply;
- a second bipolar transistor having a base coupled to the second terminal of the switch element and an emitter coupled to the output node;
- a first current source coupled between the emitter of the first bipolar transistor and a ground reference terminal;
- a third bipolar transistor having a base coupled to a voltage reference, a collector coupled to the voltage source, and an emitter coupled to the second terminal of the switch element;
- a second current source coupled between the emitter of the third bipolar transistor and the ground reference terminal; and
- a field effect transistor having a first terminal coupled to the second terminal of the switch element, a second terminal coupled to the emitter of the third bipolar transistor, and a control gate coupled to the output of an inverter, the inverter having an input coupled to the control gate of the switch element to receive the mute control signal.

8. The circuit of claim 7 wherein the switch element comprises a field effect transistor.

9. The circuit of claim 7 wherein the first bipolar transistor comprises a voltage reduction component configured to reduce the voltage level of the audio signal.

10. The circuit of claim 9 wherein the voltage reduction component reduces the voltage level of the audio signal without eliminating the audio signal prior to applying the audio signal to the input node.

11. The circuit of claim 7 wherein the second bipolar transistor comprises a voltage raising component configured to raise the voltage level of the audio signal prior to applying the audio signal to the output node.

* * * * *